United States Patent
Xu et al.

(10) Patent No.: US 9,331,655 B2
(45) Date of Patent: May 3, 2016

(54) POP-CLICK NOISE GROUNDING SWITCH DESIGN WITH DEEP SUB-MICRON CMOS TECHNOLOGY

(71) Applicant: BROADCOM CORPORATION, Irvine, CA (US)

(72) Inventors: Yang Xu, Irvine, CA (US); Dale George Frederick Stubbs, Edinburgh (GB); Khaled Mahmoud Abdelfattah Aly, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 251 days.

(21) Appl. No.: 14/020,696

(22) Filed: Sep. 6, 2013

(65) Prior Publication Data
US 2015/0016630 A1    Jan. 15, 2015

Related U.S. Application Data

(60) Provisional application No. 61/844,775, filed on Jul. 10, 2013.

(51) Int. Cl.
*H03G 3/34* (2006.01)
*H03F 1/30* (2006.01)

(52) U.S. Cl.
CPC *H03G 3/348* (2013.01); *H03F 1/30* (2013.01); *H03F 1/303* (2013.01); *H03F 1/305* (2013.01)

(58) Field of Classification Search
CPC .......... H03F 1/301–1/306; H03F 1/32; H03F 1/3205; H03F 3/34; H03F 3/38; H03F 3/343; H03F 1/26; H03F 2200/372; H04B 15/00
USPC ............ 455/218; 381/94.6; 330/10, 251, 207; 375/237, 238
See application file for complete search history.

(56) References Cited

U.S. PATENT DOCUMENTS

| | | | | |
|---|---|---|---|---|
| 5,773,999 A * | 6/1998 | Park | ...................... | G11C 7/1051 326/27 |
| 6,316,977 B1 * | 11/2001 | Sargeant | ............... | H03L 7/0896 327/157 |
| 8,526,636 B1 * | 9/2013 | Pai | .......................... | H03F 1/305 381/94.1 |
| 8,686,789 B2 * | 4/2014 | Jiang | ....................... | H03F 3/217 330/10 |
| 8,965,010 B2 * | 2/2015 | Sorace | .................... | H03F 1/305 381/120 |
| 2005/0110556 A1 * | 5/2005 | Guedon | .................. | H03F 3/217 327/390 |
| 2008/0152171 A1 * | 6/2008 | Hovesten | ........ | H01L 21/823462 381/111 |

* cited by examiner

*Primary Examiner* — Davetta W Goins
*Assistant Examiner* — Oyesola C Ojo
(74) *Attorney, Agent, or Firm* — McDermott Will & Emery LLP (57) ABSTRACT

A device for grounding pop-click noise may include an output block configured to generate an output signal at an output node. A switch circuit coupled to the output node may be configured to be operable to couple the output node to a ground potential. The switch circuit may include a first and a second transistor. A drain, a source, and a gate node of the first transistor may be coupled to the output node, a drain node of the second transistor, and a first control signal, respectively. A drain, a source, and a gate node of the second transistor may be coupled to a source node of the first transistor, the ground potential, and a second control signal, respectively. The first and the second control signals may operate the switch circuit to couple the output node to the ground potential during a pre-determined period associated with the pop-click noise.

20 Claims, 5 Drawing Sheets

POP-CLICK NOISE GROUNDING SWITCH DESIGN WITH DEEP SUB-MICRON CMOS TECHNOLOGY

CROSS-REFERENCE TO RELATED APPLICATIONS

This application claims the benefit of priority under 35 U.S.C. §119 from U.S. Provisional Patent Application 61/844,775 filed Jul. 10, 2013, which is incorporated herein by reference in its entirety.

TECHNICAL FIELD

The present description relates generally to audio electronic systems, and more particularly, but not exclusively, to pop-click grounding switch design with deep sub-micron CMOS technology.

BACKGROUND

Pop-click noise is an unwanted transient signal in audioband, resulting from enabling or disabling of one or more amplifiers of an audio system, which can be reproduced in a speaker or a headphone of the audio system. In many audio systems (e.g., hand-held devices), which depend on battery as their power source, saving power is crucial for longer battery life. The power saving may be achieved by disabling some of the functioning blocks when they are not required. Such a design practice can potentially end-up with creating pop-click noise which needs to be addressed properly.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a device and a method for grounding pop-click noise in an audio system (e.g. included in a set-top-box). The subject technology may be used in conjunction with an input amplifier (e.g., an audio amplifier). The input amplifier may be coupled to a ground referenced driver charged by a charge-pump circuit. The subject technique may use a switch circuit to short the output node of the ground reference driver during power up/down phase to avoid pop-click noise. The disclosed technique provides a solution to the challenge of implementing the pop-click noise grounding switch using the deep-submicron technology. The subject technology may include a number of advantageous features compared to the existing solutions. For example, at the circuit level, the disclosed technique may be implemented using on-chip components compatible with standard semiconductor technologies such as CMOS technology. Further, at the system level, the disclosed solution has the advantage of not requiring any dedicated on-board components for full implementation.

Figure 1A:
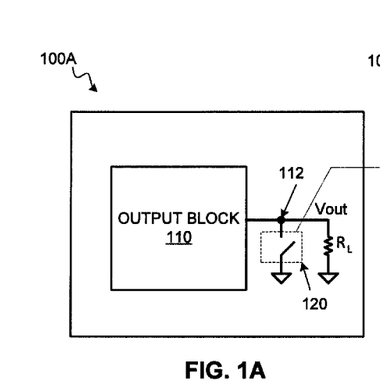
FIG. 1A illustrates an example of a device for grounding pop-click noise, in accordance with one or more implementations.

FIG. 1A illustrates an example of a device 100A for grounding pop-click noise, in accordance with one or more implementations of the subject technology. The device 100A may include an output block 110 configured to generate an output signal (e.g., Vout) at an output node 112 coupled to a load resistor $R_L$. In one or more aspects, the load resistor $R_L$ may be a resistor of a speaker or headphone coupled to the output node 112. In other aspects, the output block 110 may belong to a set-top-box (STB) that is coupled through one or more amplifier circuits to speaker(s) of a television set, and the resistor $R_L$ may be an input resistance of the amplifier circuits. In order to eliminate the pop-click noise associated with turning on and off of various circuits in the device 100A, a switch circuit 120 may be coupled between the output node 112 and the ground potential (e.g., an analog ground potential). The switch circuit 120 may be configured to be operable to couple the output node 112 to a ground potential during a predetermined time period that is associated with the pop-click noise.

Figure 1B:
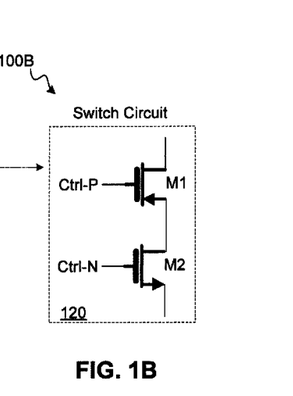
FIG. 1B illustrates an example of a switch circuit of the device of FIG. 1A for grounding pop-click noise, in accordance with one or more implementations.

FIG. 1B illustrates an example of a switch circuit 120 of the device of FIG. 1A for grounding pop-click noise, in accordance with one or more implementations of the subject technology. The switch circuit 120 may include a CMOS pair including a first transistor M1 (e.g., a PMOS or an NMOS transistor) and a second transistor M2 (e.g., an NMOS or a PMOS transistor). A drain node of the transistor M2 is coupled to a source node of the transistor M1. The gate nodes of the first and second transistors are coupled to a first control signal Ctrl-P and a second control signal Ctrl-N, respectively. The source node of the transistor M2 is coupled to the ground potential. The first and the second control signals (e.g., Ctrl-P and Ctrl-N) may operate the switch circuit 120 to couple the output node 112 to the ground potential during the pre-determined period associated with pop-click noise, as discussed in more detail herein. In one or more implementation of the subject technology, each of the first and the second transistors may include a lateral double-diffused MOS (LDMOS), a thick-oxide MOS, or a thin oxide MOS transistor. The choice of the transistor type depends on the output signal swing.

Figure 2:
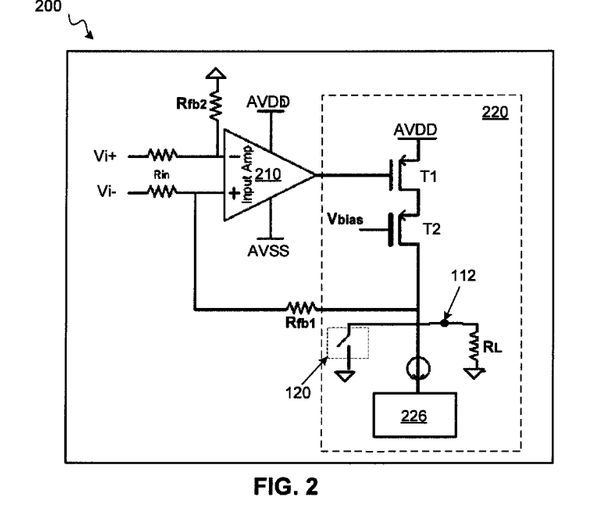
FIG. 2 illustrates an example of an audio circuit including a device for grounding pop-click noise, in accordance with one or more implementations.

FIG. 2 illustrates an example of an audio circuit 200 including a device 120 for grounding pop-click noise, in accordance with one or more implementations of the subject technology. The subject technology may be used in conjunction with audio circuit 200 including an input amplifier (e.g., an audio amplifier) 210 coupled to a ground referenced output stage 220. The input amplifier 210 may be configured to sense the input signals Vi+ and Vi− coupled to the input nodes of the amplifier through input resistors $R_{in}$, and the feedback signals provided by feedback resistors $R_{fb1}$ and $R_{fb2}$. The input amplifier 210 may generate a loop gain and a bandwidth for proper operation of the audio circuit 200. The input amplifier 210 may be biased by the supply voltages AVDD (e.g., 1.8V) and AVSS (e.g., 0V).

A simplified version of the ground referenced output stage 220, includes an output stage (e.g., in a class A configuration) formed by output transistors T1 and T2 (e.g., PMOS transistors), which are coupled together in series. Since the standard devices in the latest deep sub-micron technology cannot support high voltage swing directly, transistors T1 and T2 may be implemented with a specialized designed lateral double-diffused MOS (LDMOS), which can partially resolve the overvoltage issue. However, for the ground referenced output stage 220, the negative signal swing may restrict using LDN-MOS transistors. A gate, a source and a drain node of the transistor T1 are respectively coupled to an output node of the input amplifier 210, the supply voltage AVDD, and a source node of the transistor T2. A gate and a drain node of the transistor T2 are respectively coupled to a bias voltage ($V_{bias}$) and the output node 112 of the audio circuit 200. The output node 112 is coupled to the ground potential via the load resistor $R_L$ (e.g., 101M) and the switch circuit 120 that is operable to connect the output node 112 to the ground potential during a predetermined time period that is associated with the pop-click noise, as discussed further herein. The output stage 220 may be powered by a charge pump (e.g., negative charge pump) circuit 226.

Figure 3A:
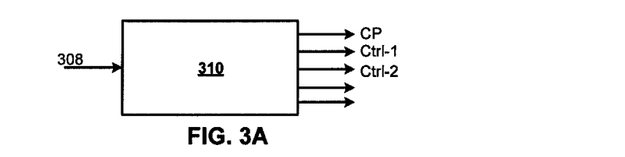
FIG. 3A-3C illustrate examples of a pop-click sequencer control block, a bias-generation circuit, and a timing diagram associated with the bias-generation circuit, in accordance with one or more implementations.
Figure 3B:
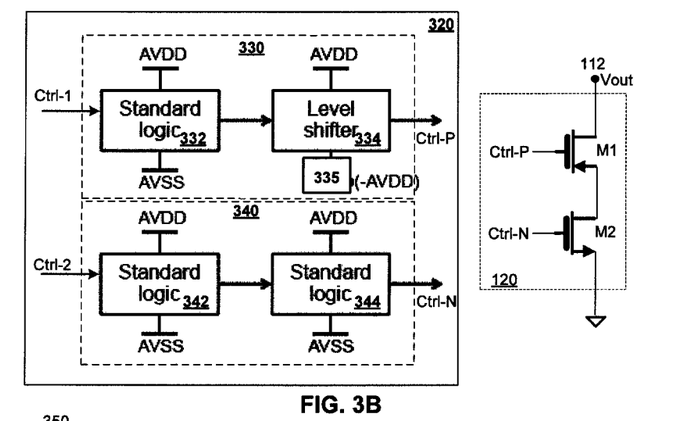
Figure 3C:
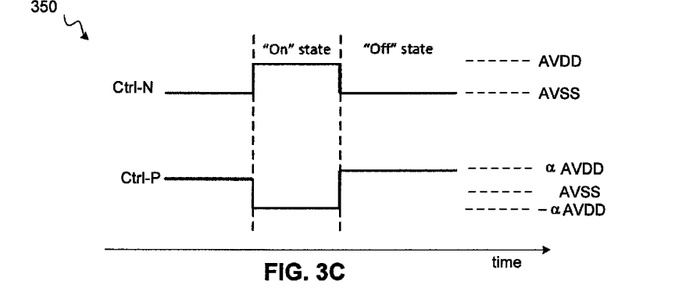

FIG. 3A-3C illustrate examples of a pop-click sequencer control block 310, a bias-generation circuit 320, and a timing diagram 350 associated with the bias-generation circuit, in accordance with one or more implementations of the subject technology. The pop-click sequencer control block 310 may include various analog/digital circuits and is configured to provide a number of control signals in response to an input signal 308. The input signal 308 may include an on/off control signal of the audio circuit 200 of FIG. 2. The control signals generated by the pop-click sequencer control block 310 may include, for example, a charge pump (CP) control signal and control signals Ctrl-1 and Ctrl-2, which are applied to a bias generation circuit 320 shown in FIG. 3B. The CP signal may control turning on/off of the charge pump circuit (e.g., 226 of FIG. 2).

The bias generation circuit 320 may include a first bias circuit 330 and a second bias circuit 340. The first bias circuit 330 may receive the control signal Ctrl-1 and generates the first control signal Ctrl-P. The first bias circuit 330 may include a logic circuit 332 and a level shifter 334. The logic circuit 332 may be implemented by known logic gates and biased by the supply voltages AVDD and AVSS. The level shifter 334 may be coupled to the supply voltages AVDD and a charge pump 335, and may generate the control signal Ctrl-P that can vary from −AVDD to αAVDD, where 0≤α≤1 and is determined by a maximum output swing of the output signal (e.g., $V_{out}$) at node 112 of FIG. 2. The charge pump 335 may comprise a small dedicated charge pump that is configured to generate the −AVDD supply voltage for biasing the level shifter 334. The second bias circuit 340 may receive the control signal Ctrl-2 and may generate the first control signal Ctrl-N. The second bias circuit 340 may include the logic circuits 342 and 344 that may be implemented by known logic gates and biased by the supply voltages AVDD and AVSS.

The operation of the switch circuit 120 may be controlled by the control signals Ctrl-P and Ctrl-N. For example, in order to turn the switch circuit 120 to a conducting state (e.g., ON) the control signal Ctrl-P may be connected to −AVDD and the control signal Ctrl-N may be connected to AVDD, which turn on both transistors M1 and M2. In the on state the switch circuit 120 may function as two resistors connected in series. The resistance of the two resistors may be determined by the dimensions of the transistors M1 and M2 and the technology used to implement the transistors. In the off state of the switch circuit 120, the control signal Ctrl-P may be connected to αAVDD and the control signal Ctrl-N may be connected to AVSS. In the off state of the switch circuit 120, under positive swing of the output voltage ($V_{out}$), transistor M1 may be turned on, while transistor M2 is off and the drain node of the transistor M2 follows the output swing. In this state, the switch circuit 120 may function as a load capacitor. However, under the negative swing of the output voltage ($V_{out}$), both transistors M1 and M2 are off. The gate-drain voltage limit of the transistor M2 may determine the maximum amplitude of the negative swing of the output voltage.

FIG. 3C shows the timing diagram 350 of the control signals Ctrl-N and Ctrl-P. As shown in the timing diagram 350, during the on state of the switch circuit 120, the control signal Ctrl-N is high (e.g., at AVDD) and the control signal Ctrl-P is low (e.g., at −AVDD), whereas in the off state of the switch circuit 120, the control signal Ctrl-N is at AVSS level and the control signal Ctrl-P is at αAVDD level.

Figure 4:
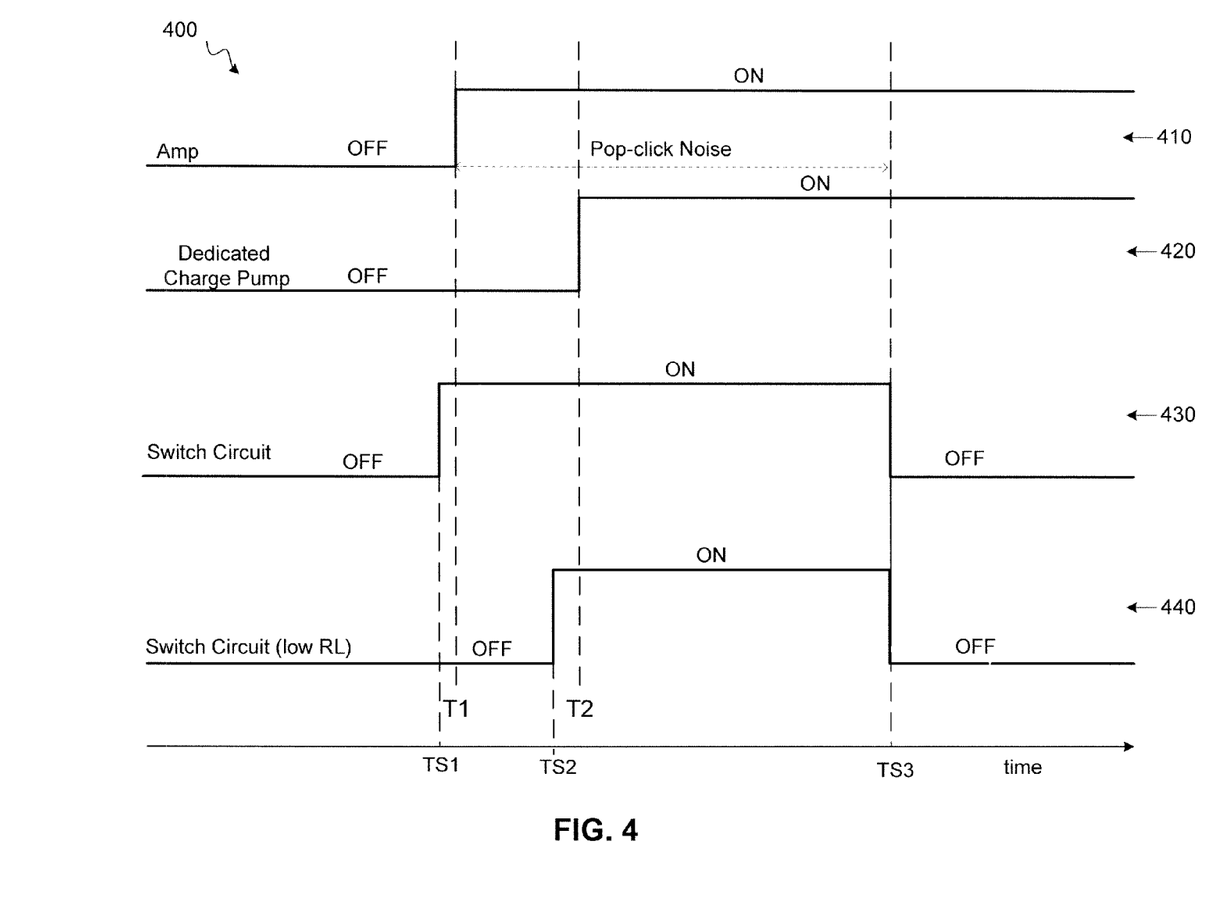
FIG. 4 illustrates an example of a timing diagram for the audio circuit of FIG. 2, in accordance with one or more implementations.

FIG. 4 illustrates an example of a timing diagram 400 for the audio circuit 200 of FIG. 2, in accordance with one or more implementations of the subject technology. In the timing diagram 400, four signals 410, 420, 430, and 440 are shown. The signal 410 is the turn on/off control signal of the input amplifier 210 of FIG. 2. The input amplifier 210 is off before a time T1 and transitions to an on state at the time T1. The signal 420 is associated with the charge pump 335 of FIG. 3B and is configured to transition to an on state at a time T2 after the time T1. In order to avoid the pop-click noise due to transitions at the times T1 and T2, the switch circuit 120 of FIG. 3B may be turned on (as shown by signal 430) at a time TS1 right before T1, so that the switch is on and the output node 112 of FIG. 3B is grounded when transitions at T1 and T2 occur. This can short the pop-click noise to the ground potential. The switch circuit 120 can be turned off at a time TS3, when all transitions associated with the audio circuit 200 of FIG. 2, including transitions at T1 and T2 are over. In one or more implementations, if the load resistor $R_L$ of FIG. 2 is low (e.g., a few Ω such as 16Ω), the switch circuit 120 may be turned on at a time TS2, right before the transition at time T2 (as shown by signal 440), and may stay off before time TS2 as, in this case, the pop-click noise can be insignificant between times TS1 and TS2.

Figure 5:
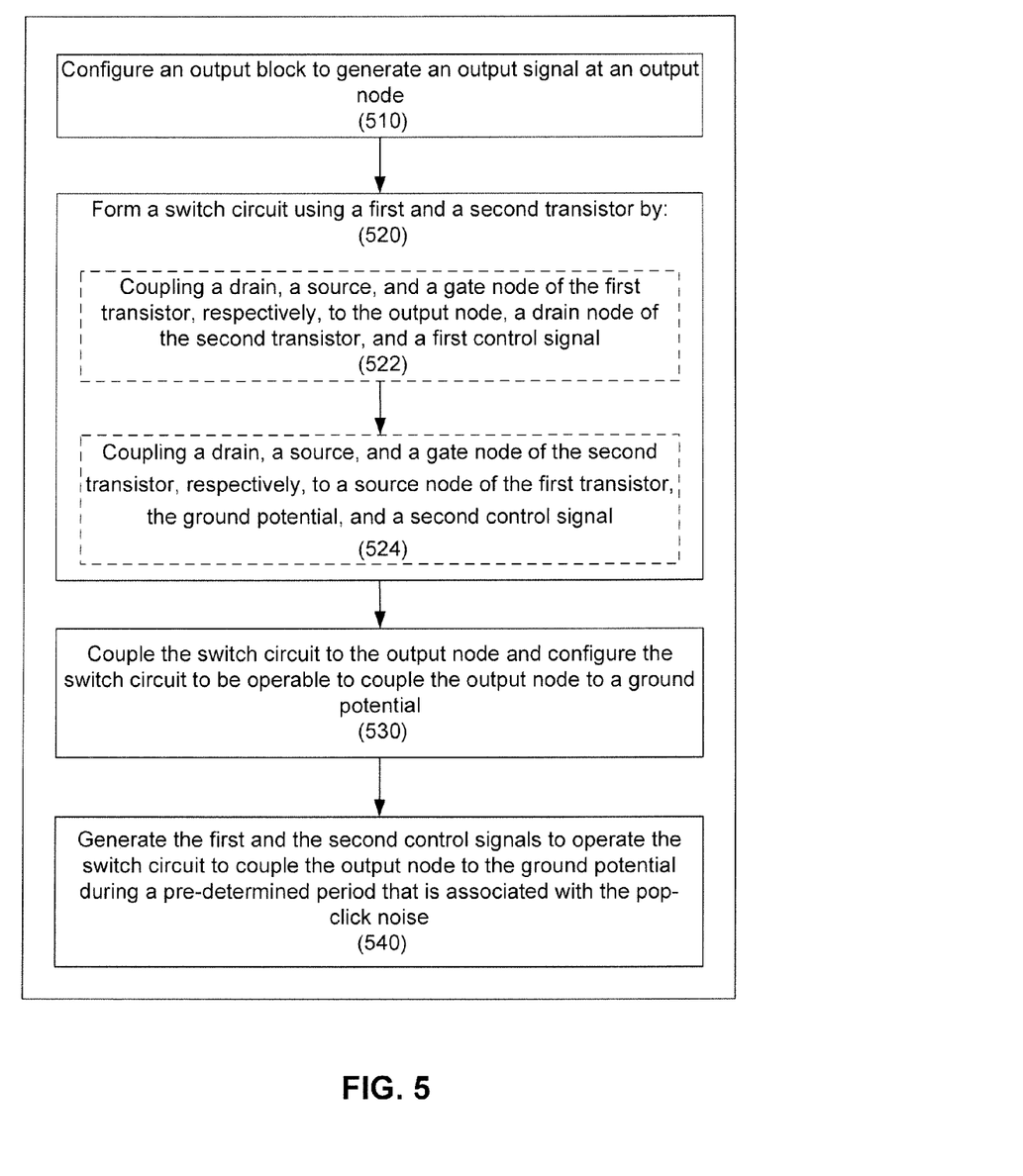
FIG. 5 illustrates an example of a method for grounding pop-click noise, in accordance with one or more implementations.

FIG. 5 illustrates an example of a method 500 for grounding pop-click noise, in accordance with one or more implementations of the subject technology. The method 500 begins at operation block 510, where an output block (e.g., 110 of FIG. 1A and 220 of FIG. 2) may be configured to generate an output signal (e.g., $V_{out}$ of FIG. 1A). At operation block 520, a switch circuit (e.g., 120 of FIG. 1B) may be formed by using a first transistor (e.g., M1 of FIG. 1B) and a second transistor (e.g., M2 of FIG. 1B) by: coupling, at operation block 522, a drain, a source, and a gate node of the first transistor, respectively, to the output node (e.g., 112 of FIG. 1A), a drain node of the second transistor, and a first control signal (e.g., Ctrl-P of FIG. 1B); and coupling, at operation block 524, a drain, a source, and a gate node of the second transistor, respectively, to a source node of the first transistor, the ground potential, and a second control signal (e.g., Ctrl-N of FIG. 1B).

At operation block 530, the switch circuit may be coupled to the output node and the switch circuit may be configured to be operable to couple the output node to a ground potential. At operation block 540, the first and the second control signals may be generated (e.g., by 320 of FIG. 3B) to operate the switch circuit to couple the output node to the ground potential during a pre-determined period that is associated with the pop-click noise (e.g., on state of FIG. 3C, and in FIG. 4, the time period between TS1 and TS3, and the time periods between TS2 and TS3 for low values of $R_L$).

Figure 6:
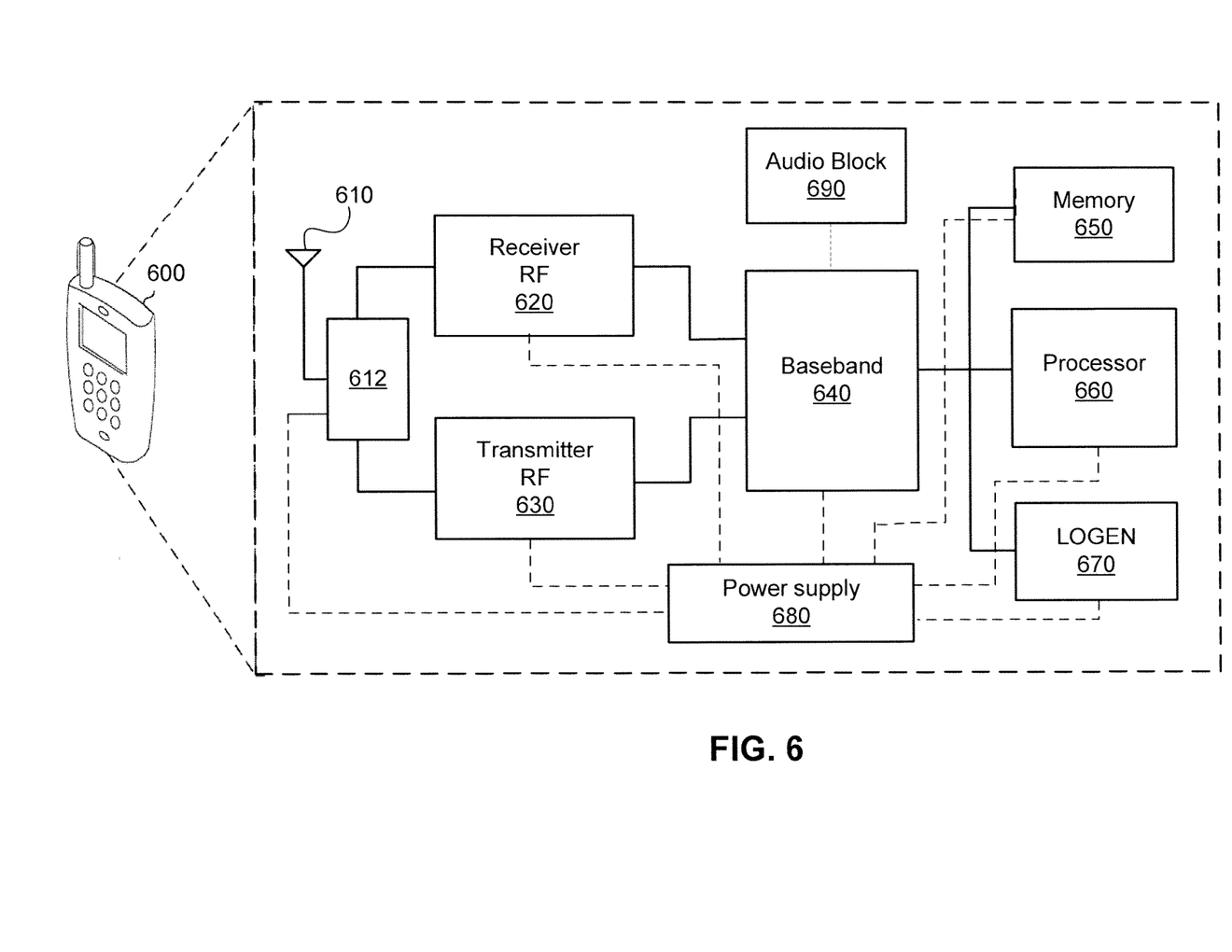
FIG. 6 illustrates an example wireless communication device, in accordance with one or more implementations.

FIG. 6 illustrates an example wireless communication device 600 in accordance with one or more implementations of the subject technology. The wireless communication device 600 may comprise a radio-frequency (RF) antenna 610, a receiver 620, a transmitter 630, a baseband processing module 640, a memory 650, a processor 660, a local oscillator generator (LOGEN) 670, a power supply 680, and an audio block 690. In various embodiments of the subject technology, one or more of the blocks represented in FIG. 6 may be integrated on one or more semiconductor substrates. For example, the blocks 620-670 may be realized in a single chip or a single system on chip, or may be realized in a multi-chip chipset.

The RF antenna 610 may be suitable for transmitting and/or receiving RF signals (e.g., wireless signals) over a wide range of frequencies. Although a single RF antenna 610 is illustrated, the subject technology is not so limited.

The receiver 620 may comprise suitable logic circuitry and/or code that may be operable to receive and process signals from the RF antenna 610. The receiver 620 may, for example, be operable to amplify and/or down-covert received wireless signals. In various embodiments of the subject technology, the receiver 620 may be operable to cancel noise in received signals and may be linear over a wide range of frequencies. In this manner, the receiver 620 may be suitable for receiving signals in accordance with a variety of wireless standards. Wi-Fi, WiMAX, Bluetooth, and various cellular standards. In various embodiments of the subject technology, the receiver 620 may not require any SAW filters and few or no off-chip discrete components such as large capacitors and inductors.

The transmitter 630 may comprise suitable logic circuitry and/or code that may be operable to process and transmit signals from the RF antenna 610. The transmitter 630 may, for example, be operable to up-covert baseband signals to RF signals and amplify RF signals. In various embodiments of the subject technology, the transmitter 630 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 630 may be operable to provide signals for further amplification by one or more power amplifiers.

The duplexer 612 may provide isolation in the transmit band to avoid saturation of the receiver 620 or damaging parts of the receiver 620. Furthermore, the duplexer 612 may attenuate the noise in the receive band. The duplexer may be operable in multiple frequency bands of various wireless standards.

The baseband processing module 640 may comprise suitable logic, circuitry, interfaces, and/or code that may be operable to perform processing of baseband signals. The baseband processing module 640 may, for example, analyze received signals and generate control and/or feedback signals for configuring various components of the wireless communication device 600 such as the receiver 620. The baseband processing module 640 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control transfers of data between various portions of the wireless communication device 600. Additionally, the processor 660 may enable implementation of an operating system or otherwise execute code to manage operations of the wireless communication device 600.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various embodiment of the subject technology, Information stored in the memory 650 may be utilized for configuring the receiver 620 and/or the baseband processing module 640.

The local oscillator generator (LOG EN) 670 may comprise suitable logic, circuitry, interfaces, and/or code that may be operable to generate one or more oscillating signals of one or more frequencies. The LOGEN 670 may be operable to generate digital and/or analog signals. In this manner, the LOGEN 670 may be operable to generate one or more clock signals and/or sinusoidal signals. Characteristics of the oscillating signals such as the frequency and duty cycle may be determined based on one or more control signals from, for example, the processor 660 and/or the baseband processing module 640.

In operation, the processor 660 may configure the various components of the wireless communication device 600 based on a wireless standard according to which it is desired to receive signals. Wireless signals may be received via the RF antenna 610 and amplified and down-converted by the receiver 620. The baseband processing module 640 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 650, and/or information affecting and/or enabling operation of the wireless communication device 600. The baseband processing module 640 may modulate, encode and perform other processing on audio, video, and/or control signals to be transmitted by the transmitter 630 in accordance to various wireless standards. The power supply 680 may provide one or more regulated rail voltages (e.g., $V_{DD}$) for various circuitries of the wireless communication device 600.

The audio block 690 may include one or more audio amplifiers and may provide audio signals to be played by one or more speakers of the communication device 600 or one or more headphones coupled to the communication device 600. In one or more implementations of the subject technology, the audio block 690 may include the switch circuit 120 of FIG. 1B that enables grounding of the pop-click noise of the audio block 690.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for grounding pop-click noise, the device comprising:
   an output block configured to generate an output signal at an output node; and
   a switch circuit coupled to the output node and configured to be operable to couple the output node to a ground potential, the switch circuit comprising:
   a first transistor; and
   a second transistor,
   wherein:
   a drain, a source, and a gate node of the first transistor are respectively coupled to the output node, a drain node of the second transistor, and a first control signal,
   a drain, a source, and a gate node of the second transistor are respectively coupled to a source node of the first transistor, the ground potential, and a second control signal,
   the first and the second control signals are configured to operate the switch circuit to couple the output node to the ground potential during a pre-determined period that is associated with the pop-click noise, and
   the pre-determined period comprises a time period that starts before a turn-on time of the audio output block and ends after one or more transient events.

2. The device of claim 1, wherein the first transistor is a PMOS transistor and the second transistor is an NMOS transistor, and wherein each of the first and the second transistors comprises one of a lateral double-diffused MOS (LDMOS), a thick-oxide MOS, or a thin oxide MOS transistor.

3. The device of claim 1, wherein the first transistor is an NMOS transistor and the second transistor is a PMOS transistor, and wherein each of the first and the second transistors comprises one of a lateral double-diffused MOS (LDMOS), a thick-oxide MOS, or a thin oxide MOS transistor.

4. The device of claim 1, wherein the one or more transient event comprises turning-on of a charge pump, and wherein the pre-determined period comprises a time period that starts right before a turn-on time of the charge pump if a load resistor coupled to the output node is small.

5. The device of claim 1, further comprising a bias-generation circuit configured to generate the first and the second control signals, wherein the bias-generation circuit comprises a first-bias circuit that generates the first control signal and a second-bias circuit that generates the second control signal.

6. The device of claim 5, wherein the first-bias circuit comprises a level-shifter and a charge pump and is configured to generate the first control signal that transitions from −α AVDD to +α AVDD to turn the switch circuit, wherein AVDD comprises an analog supply voltage, and wherein the charge pump comprises a small dedicated charge pump and is configured to generate a negative AVDD supply voltage for the level-shifter.

7. The device of claim 5, wherein the second-bias circuit comprises logic circuits configured to generate the second control signal that transitions between AVSS and AVDD values to allow the switch circuit to transition from a conducting state to a non-conducting state, wherein AVDD and AVSS comprise analog supply voltages.

8. The device of claim 1, wherein the output block comprise an audio-output block, wherein the audio-output block comprises a ground referenced driver circuit.

9. The device of claim 1, wherein the switch circuit is implemented in a sub-micron CMOS technology, and wherein the switch circuit is configured to eliminate the pop-click noise.

10. A method for grounding pop-click noise, the method comprising:
  configuring an output block to generate an output signal at an output node;
  forming a switch circuit using a first and a second transistor by:
    coupling a drain, a source, and a gate node of the first transistor, respectively, to the output node, a drain node of the second transistor, and a first control signal; and
    coupling a drain, a source, and a gate node of the second transistor, respectively, to a source node of the first transistor, the ground potential, and a second control signal;
  coupling the switch circuit to the output node and configuring the switch circuit to be operable to couple the output node to a ground potential;
  generating the first and the second control signals to operate the switch circuit to couple the output node to the ground potential during a pre-determined period that is associated with the pop-click noise and
  the pre-determined period comprises a time period that begins before a turn-on time of the audio out t block and ends after one or more transient events.

11. The method of claim 10, wherein forming the switch circuit comprises using a PMOS transistor as the first transistor and an NMOS transistor as the second transistor, and wherein each of the first and the second transistors comprises one of a lateral double-diffused MOS (LDMOS), a thick-oxide MOS, or a thin oxide MOS transistor.

12. The method of claim 10, wherein forming the switch circuit comprises using an NMOS transistor as the first transistor and a PMOS transistor as the second transistor, and wherein each of the first and the second transistors comprises one of a lateral double-diffused MOS (LDMOS), a thick-oxide MOS, or a thin oxide MOS transistor.

13. The method of claim 10, wherein the one or more transient event comprise turning-on of a charge pump, and wherein the pre-determined period comprises a time period that begins right before a turn-on time of the charge pump if a load resistor coupled to the output node is small.

14. The method of claim 10, further comprising configuring a bias-generation circuit to generate the first and the second control signals, wherein configuring the bias-generation circuit comprises configuring a first-bias circuit to generate the first control signal and configuring a second-bias circuit to generate the second control signal.

15. The method of claim 14, further comprising forming the first-bias circuit using a level-shifter and configuring the first-bias circuit to generate the first control signal that transitions from −α AVDD to +α AVDD to turn the switch circuit, wherein AVDD comprises an analog supply voltage.

16. The method of claim 14, further comprising forming the second-bias circuit using logic circuits and configuring the logic circuits to generate the second control signal that transitions between AVSS and AVDD values and allows the switch circuit to transition from a conducting state to a non-conducting state, wherein AVDD and AVSS comprise analog supply voltages.

17. The method of claim 10, wherein configuring the output block comprises configuring an audio-output block comprising a ground referenced driver circuit.

18. The method of claim 10, further comprising implementing the switch circuit in a sub-micron CMOS technology, and configuring the switch circuit to eliminate the pop-click noise.

19. A set-top-box (STB) comprising:
  an audio circuit configured to generate an audio signal at an audio output node; and
  a switch circuit coupled to the audio output node and configured to provide a ground path for pop-click noise generated by the audio circuit, the switch circuit comprising:
    a first transistor; and
    a second transistor,
  wherein:
    a drain, a source, and a gate node of the first transistor are respectively coupled to the output node, a drain node of the second transistor, and a first control signal,
    a drain, a source, and a gate node of the second transistor are respectively coupled to a source node of the first transistor, the ground potential, and a second control signal, and
    the first and the second control signals are configured to operate the switch circuit to couple the audio output node to a ground potential during a pre-determined period that is associated with the pop-click noise, and
    the pre-determined period comprises a time period that begins before a turn-on time of the audio output block and ends after one or more transient events.

20. The STB of claim 19, wherein:
  the first transistor is a PMOS transistor and the second transistor is an NMOS transistor,
  each of the first and the second transistors comprises one of a lateral double-diffused MOS (LDMOS), a thick-oxide MOS, or a thin oxide MOS transistor,
  the one or more transient event comprises turning-on of a charge pump, and the pre-determined period comprises a time period that starts right before a turn-on time of the charge pump if a load resistor coupled to the output node is small.

* * * * *